United States Patent
Tsu et al.

(10) Patent No.: US 7,402,514 B2
(45) Date of Patent: Jul. 22, 2008

(54) LINE-TO-LINE RELIABILITY ENHANCEMENT USING A DIELECTRIC LINER FOR A LOW DIELECTRIC CONSTANT INTERLEVEL AND INTRALEVEL (OR INTERMETAL AND INTRAMETAL) DIELECTRIC LAYER

(75) Inventors: Robert Tsu, Plano, TX (US); Joe W. McPherson, Plano, TX (US); William R. McKee, Plano, TX (US); Thomas Bonifield, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/350,451

(22) Filed: Jan. 24, 2003

(65) Prior Publication Data
US 2004/0147112 A1   Jul. 29, 2004

(51) Int. Cl.
*H01L 21/4763* (2006.01)
(52) U.S. Cl. ........................ 438/637; 438/639; 438/685; 438/687; 257/E21.579
(58) Field of Classification Search ......... 438/637–640, 438/685, 687
See application file for complete search history.

(56) References Cited

U.S. PATENT DOCUMENTS 5,604,156 A * 2/1997 Chung et al. ................ 438/620
5,985,762 A * 11/1999 Geffken et al. .............. 438/687
6,197,688 B1 * 3/2001 Simpson ..................... 438/678

FOREIGN PATENT DOCUMENTS

EP          0795895 A2 *   9/1997

OTHER PUBLICATIONS

Tsu, "Leakage and Breakdown Reliability Issues Associated with Low-k Dielectrics In a Dual-Damascene Cu Process", Int'l Rel. Phys. Sym. Proc. (IEEE, 2000), pp. 348-352.

* cited by examiner

*Primary Examiner*—Alexander G Ghyka
(74) *Attorney, Agent, or Firm*—Frederick J. Telecky, Jr.; Wade J. Brady, III

(57) ABSTRACT

An embodiment of the instant invention is a method of providing a connection between a first conductor and a second conductor wherein the first conductor is situated under the second conductor and separated by a first insulating layer, the method comprising the steps of: forming an opening in the first insulating layer (layer 124 or 128 of FIGS. 1-4), the opening having a top, a bottom and sidewalls and is situated between the first conductor and the second conductor; forming a second insulating layer (layer 134, 138, and 142 of FIGS. 3 and 4) exclusively on the sidewalls of the opening thereby leaving a smaller opening in the first insulating layer; forming a conductive material (material 140 of FIGS. 3 and 4) in the smaller opening; and wherein the first insulating layer is comprised of a low-k material and the second insulating layer is comprised of an insulator which has electrical leakage properties which are less than the electrical leakage properties of the first insulating layer.

14 Claims, 1 Drawing Sheet

LINE-TO-LINE RELIABILITY ENHANCEMENT USING A DIELECTRIC LINER FOR A LOW DIELECTRIC CONSTANT INTERLEVEL AND INTRALEVEL (OR INTERMETAL AND INTRAMETAL) DIELECTRIC LAYER

FIELD OF THE INVENTION

The instant invention pertains to semiconductor device fabrication and processing and more specifically to a structure and methods of enhancing line-to-line reliability by incorporating a liner between copper structures and low dielectric constant materials.

BACKGROUND OF THE INVENTION

In today's semiconductor device manufacturing industry, the cost to fabricate these devices needs to lessen, the number of devices that can be fit onto a single chip needs to increase, and the power consumed by each of these devices needs to be reduced. In an effort to achieve these goals, semiconductor device manufacturers have started to use interlevel and intralevel dielectrics which have lower dielectric constants so that adjacent conductors can be placed closer together without increasing the interaction between these two adjacent lines. In addition, semiconductor device manufacturers are starting to incorporate copper metallization into these devices so as to increase device reliability and to decrease the resistance of these conductive lines.

However, there are problems with implementing copper metallization and with using lower dielectric constant materials ("low-k materials" or "low-k dielectrics"). Copper structures are not easily etched without damaging other device structures. To alleviate this problem, a damascene process, which creates recesses in the dielectric layer for the copper interconnects to be formed within, is being attempted by many semiconductor device manufacturers. This process typically involves forming a copper layer over the dielectric layer, which has via holes and interconnect patterns already formed in them, and within the via holes and interconnect patterns. This formation step can be accomplished by electrochemical deposition (plating) or by another deposition technique. After the copper is formed, the wafers are removed from the deposition or plating tool and placed in a chemical-mechanical polishing ("CMP") device. The CMP process is utilized to remove any unwanted copper structures and to planarize the desired copper interconnect structures.

If the dielectric layer is formed of low-k material, a couple problems arise with regards to the integration of the copper structures with the low-k material. First, some low-k materials can not withstand the downward pressure that it must withstand from the polishing device during the polishing of the copper layer. Second, the low-k material may not be able to withstand the polishing process necessary to clear all of the copper from the surface of the low-k material. In other words, some overpolishing of the copper layer must be performed to assure that all of the copper is cleared from atop of the low-k material. However, during this overpolishing step, some portions of the low-k material will be subjected to this polishing. If the low-k material is not robust enough to withstand this polishing, an undesirable amount of the low-k material may be polished away. Third, some low-k materials have low electrical breakdown strength and high line-to-line electrical leakage properties when formed between two conductors. Hence, while the capacitive-type (or crosstalk type) interaction between the two adjacent lines is lessened by the low-k material situated between the two lines, the leakage between the two lines may be increased due to the electrical leakage properties of some low-k materials.

In light of this, a need has arisen for the integration of low-k materials and copper metallization while reducing the leakage between adjacent copper lines due to the electrical leakage properties of some low-k materials.

SUMMARY OF THE INVENTION

An embodiment of the instant invention is a method of providing a connection between a first conductor and a second conductor wherein the first conductor is situated under the second conductor and separated by a first insulating layer, the method comprising the steps of: forming an opening in the first insulating layer, the opening having a top, a bottom and sidewalls and is situated between the first conductor and the second conductor; forming a second insulating layer exclusively on the sidewalls of the opening thereby leaving a smaller opening in the first insulating layer; forming a conductive material in the smaller opening; and wherein the first insulating layer is comprised of a low-k material and the second insulating layer is comprised of an insulator which has electrical leakage properties which are less than the electrical leakage properties of the first insulating layer. The second insulating material is, preferably, comprised of: an oxide, PETEOS, low temperature LPCVD oxide, SiON, BLoK, Si3N4, SiO2, or any stack or combination thereof, and is, preferably, around 5 to 15 nm thick. Preferably, the first insulating layer is comprised of: BPSG, PSG, FSG, an oxide, a nitride, an oxynitride, spun-on glass, aerogel, xerogel, HSQ, parylene, SiLK, BLoK, or any stack or combination thereof.

Another embodiment of the instant invention is a method of forming an electronic device situated over a semiconductor substrate, the method comprising the steps of: forming a first conductor over the semiconductor substrate; forming a first insulating layer on the first conductor, the first insulating layer having an opening so as to expose a portion of the first conductor and the opening having sidewalls; forming a second insulating layer on the sidewalls of the first insulating layer thereby decreasing the size of the opening in the first insulating layer; forming a second conductive material in the decreased opening in the first insulating layer, the second conductive material electrically connecting the first conductor to a second conductor; and wherein the second insulating layer has a lower electrical leakage than the first insulating layer. Preferably, the second insulating material is comprised of: an oxide, PETEOS, low temperature LPCVD oxide, SiON, BLoK, Si3N4, SiO2, or any stack or combination thereof, and is around 5 to 15 nm thick. The first insulating layer is, preferably, comprised of: BPSG, PSG, FSG, an oxide, a nitride, an oxynitride, spun-on glass, aerogel, xerogel, HSQ, parylene, SiLK, BLoK, BLACK DIAMOND, or any stack or combination thereof. Preferably, the first and second conductors are comprised of: copper, aluminum, aluminum doped with copper, tungsten, titanium, titanium nitride, tantalum, tantalum nitride, tungsten nitride, a silicide, or any combination or stack thereof.

BRIEF DESCRIPTION OF THE DRAWINGS

Similar reference numerals are used throughout the figures to designate like or equivalent features. The figures are not drawn to scale. They are merely provided to illustrate the affect of the method of the instant invention.

DETAILED DESCRIPTION OF THE DRAWINGS

While the following description of the instant invention is centered around the embodiment as illustrated in FIGS. 1-4, one of ordinary skill in the art would know that the instant interlevel dielectric and metallization scheme of the instant invention can be used for any type of device. Hence, the underlying device may be a transistor, a memory device, an analog device, a digital device, or any other device(s) which requires different levels of metallization to provide the necessary interconnections. In addition, while the metallization scheme describe below centers on copper metallization, any type of metallization can be used. Aluminum, aluminum doped with copper, or any other type of refractory metal may be used in place of the copper described below.

Figure 1:
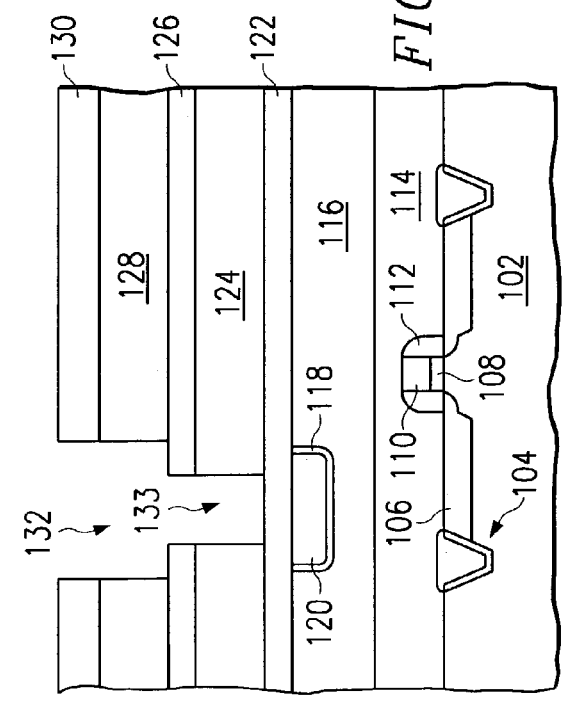

Referring to FIG. 1, isolation structures 104 are formed in semiconductor structure 102. Isolation structures 104 are depicted in FIGS. 1-4 as shallow trench isolation structures ("STI"), but they can be field oxide structures, LOCOS structures, doped isolation structures or any other commonly used isolation structures. Semiconductor structure 102 is preferably comprised of single-crystal silicon, but it may be comprised of an epitaxial silicon layer formed on a single-crystal silicon substrate. Source/drain regions 106 (which may or may not include source/drain extensions as are illustrated in FIGS. 1-4) are formed of either p-type dopants or n-type dopants depending on whether this is a PMOS or NMOS structure. Conductive gate structure 110 is formed on gate insulator 108. Conductive gate structure 110 may be comprised of polycrystalline silicon (either doped or undoped), which may or may not be silicided, or a metal (such as Ti, TiN, W, tungsten nitride, Ta, TaN, or any other metal or its nitride). Gate insulator 108 may be comprised of an oxide, a nitride, an oxynitride, an oxide/nitride stack, a high dielectric constant material, or any other conventional gate insulator. Sidewall spacers 112 are formed on the sides of the gate structure. Interlevel dielectric 114 is formed over the device. A contact may be formed in this layer. The contact would provide a connection to either the source, the drain, or the gate structure or any other device element that requires an external connection. The contact is not illustrated in the instant figures. Preferably, interlevel dielectric 114 is comprised of BPSG, PSG, FSG, an oxide, a nitride, an oxynitride, a spun-on glass ("SOG"), a low-k material (such as aerogel, xerogel, HSQ, parylene, SiLK (low-k polymer materials), or any other low-k material), or any other interlevel dielectric used in the industry.

Another interlevel dielectric layer 116 is formed on dielectric layer 114. Preferably, interlevel dielectric 116 is comprised of BPSG, PSG, FSG, an oxide, a nitride, an oxynitride, a spun-on glass ("SOG"), a low-k material (such as aerogel, xerogel, HSQ, parylene, SiLK, or any other low-k material), or any other interlevel dielectric used in the industry. First level metal 120 is formed either within (as is shown) or on top of interlevel dielectric layer 116. Preferably, liner layer 118 is formed between metal 120 and dielectric layer 116. Preferably, metal 120 is comprised of copper, aluminum, aluminum doped with copper, tungsten, titanium, titanium nitride, or any combination or stack thereof. Liner layer 118 is, preferably, comprised of Ti, TiN, Ta, TaN, tungsten, or any combination or stack thereof. After metal 120 formation, the dielectric layer 116 serves as an intrametal dielectric in between metal lines.

Via stop layer 122 is formed on interlevel dielectric 116 and metal layer 120. Preferably, via stop layer 122 is around 10 to 100 nm thick (more preferably around 30 to 50 nm thick) and is comprised of silicon nitride, an oxynitride, an oxide, BLoK (SiC based materials used as a Cu capping barrier and etch stop layer), a combination or stack thereof, or any other conventional insulator. Interlevel dielectric 124 is formed on layer 122. Preferably, interlevel dielectric layer 124 is around 100 to 500 nm thick (more preferably around 200 to 350 nm thick) and comprised of a low-k material such as aerogel, xerogel, parylene, SiLK, HSQ, BLACK DIAMOND, an airgap, or any other conventional low-k material. Trench stop layer 126 is formed on interlevel dielectric 124 and patterned and etched to have the same via configuration as interlevel dielectric 124. Preferably, trench stop layer 126 is around 10 to 100 nm thick (more preferably around 30 to 50 nm thick) and is comprised of an oxide, a nitride, an oxynitride, an oxide/nitride stack, BLoK (SiC based materials used as a Cu capping barrier and etch stop layer), or any other dielectric material which is not appreciable etched when interlevel dielectric 128 is etched.

Intralevel dielectric 128 is formed on trench stop layer 126, and is preferably on the order of 50 to 500 nm thick (more preferably on the order of 100 to 350 nm thick—most preferably around 150 to 250 nm thick). Preferably, interlevel dielectric 128 is comprised of a low-k material, such as aerogel, xerogel, HSQ, SiLK, an airgap, parylene, BLACK DIAMOND, or other conventional low-k material, or any other dielectric material, such as BPSG, PSG, FSG, an oxide, an oxynitride, PETEOS, or TEOS. Hardmask 130 is formed on intralevel dielectric 128 and is patterned and etched so as to form a trench 132 which is at least partially coextensive with via 133. Hardmask 130 is, preferably, comprised of an oxide (such as SiO2), a nitride (such as Si3N4), an oxynitride (such as SiON), BLoK, or any other conventional dielectric, and is, preferably, on the order of 50 to 350 nm thick (more preferably around 50 to 150 nm thick).

Figure 2:
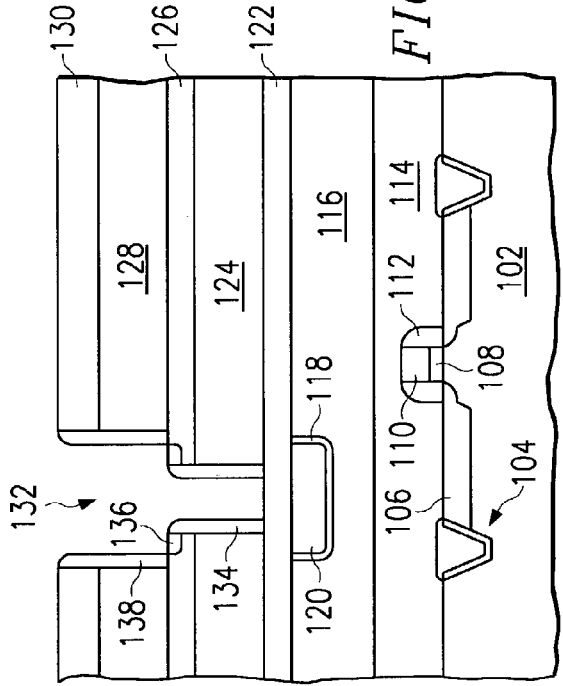
FIGS. 1-4 are cross-sectional views of a partially fabricated device which is fabricated using the method of one embodiment of the instant invention.

Referring to FIG. 2, insulating side walls 134 and 138 are formed on the sides of via 133 and trench 132. These side wall insulators may be formed by depositing an insulating material (preferably an oxide, PETEOS, low temperature LPCVD oxide, SiON, BLoK, Si3N4, SiO2, or any other insulating material which has good electrical leakage properties and which can be formed on the sidewalls of the trench and via without filling the entire trench and via) and then etching the material so as to clear the insulating material from the top of layer 130 and the exposed portion of layer 122 (while leaving the sidewall regions in tact). Some oxidation or nitridation of the exposed portion of layer 126 may occur and is illustrated as regions 136.

In one preferred embodiment of the instant invention, sidewall regions 134 and 138 are formed by depositing either PETEOS or low-temperature LPCVD silicon oxide on the entire device. The thickness of this layer is preferably around 5 to 15 nm. Next, an anisotropic etch is, preferably, performed using down stream plasma so as to remove the portions of the insulating layer from the top of layer 130 and the exposed top portion of layer 122. Preferably, this etch step is performed for less than a 10 nm overetch.

Figure 3:
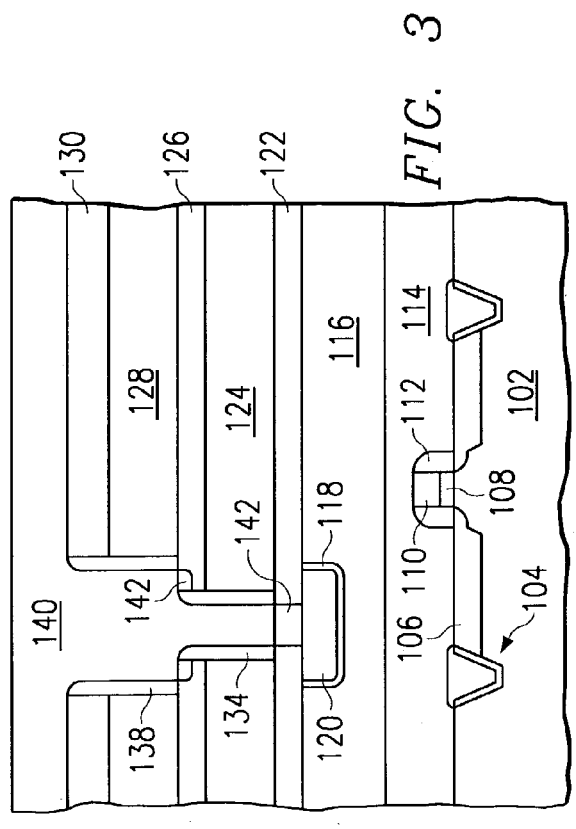

Referring to FIG. 3, conductive material 140 is blanketly formed. Preferably, conductive material 140 is comprised of copper, aluminum, aluminum doped with copper, tungsten, titanium, titanium nitride or any other conductive material, and conductive material 140 may additionally be comprised of an underlying conductive liner (not shown) which may be comprised of Ti, TiN, Ta, TaN, WN, TiSiN, TaSiN, WSiN, or a combination thereof. Conductor 140 may either be deposited, plated, or formed in any other convention manner, and the thickness of conductor 140 is preferably around 500 to 1000 nm. In order to facilitate the connection between conductor 140 and conductor 120, the portion of layer 122 that lies between these two conductors may either be removed prior to the formation of conductor 140 or it should be converted to a more conducting form.

Figure 4:
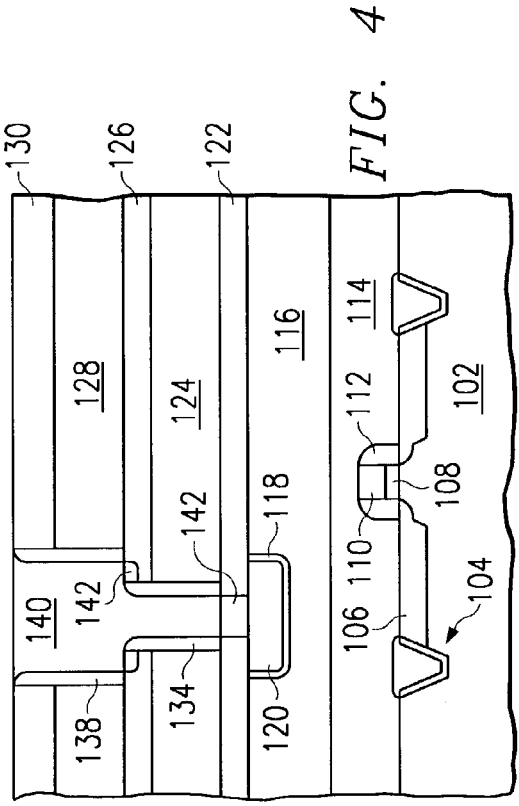

Referring to FIG. 4, the portions of conductor 140 which overlie layer 130 are removed. Preferably, this is accomplished using CMP. However, one of ordinary skill in the art will know, based on the teachings herein, of other methods of removing these portions of conductor 140. One example is to use electrical polishing, a reverse step of electroplating.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What we claim is:

1. A method of fabricating a second conductor in an integrated circuit, the second conductor to be in electrical connection with a first conductor that is situated under the second conductor and separated from the second conductor by a first insulating layer comprised of a low-k material, said method comprising the steps of:

forming an opening in said first insulating layer, said opening having a top, a bottom and sidewalls;

forming a second insulating layer, consisting essentially of silicon dioxide, on said sidewalls of said opening in said first insulating layer;

then forming a conductive liner layer on said sidewalls of said opening in said first insulating layer; and forming a conductive material in said opening in electrical contact with the first conductor at the bottom of the opening.

2. The method of claim 1, wherein the silicon dioxide of said second insulating material is comprised of a PETEOS oxide.

3. The method of claim 1, wherein said second insulating layer is around 5 to 15 nm thick.

4. The method of claim 1, wherein said first insulating layer is comprised of: BPSG, PSG, FSG, an oxide, a nitride, an oxynitride, spun-on glass, aerogel, xerogel, HSQ, parylene, SiLK, BLoK, or any stack or combination thereof.

5. The method of claim 1, further comprising:

removing portions of the second conductive material overlying the first insulating layer to define a second conductor formed of the second conductive material within the opening;

and wherein said second insulating layer has a lower electrical leakage than said first insulating layer.

6. The method of claim 5, wherein the silicon dioxide of said second insulating material is comprised of a PETEOS oxide.

7. The method of claim 5, wherein said second insulating layer is around 5 to 15 nm thick.

8. The method of claim 5, wherein said first insulating layer is comprised of:

BPSG, PSG, FSG, an oxide, a nitride, an oxynitride, spun-on glass, aerogel, xerogel, HSQ, parylene, SiLK, BLoK, BLACK DIAMOND, or any stack or combination thereof.

9. The method of claim 5, wherein said first conductor is comprised of:

copper, aluminum, aluminum doped with copper, tungsten, titanium, titanium nitride, tantalum, tantalum nitride, tungsten nitride, a silicide, or any combination or stack thereof.

10. The method of claim 5, wherein said second conductor is comprised of:

copper, aluminum, aluminum doped with copper, tungsten, titanium, titanium nitride, tantalum, tantalum nitride, tungsten nitride, a silicide, or any combination or stack thereof.

11. The method of claim 1, wherein the conductive material comprises copper.

12. The method of claim 11, wherein the conductive liner layer comprises a material selected from a group consisting of: titanium, titanium nitride, tantalum, tantalum nitride, tungsten nitride, titanium-silicon-nitride, tantalum-silicon-nitride, and tungsten-silicon-nitride.

13. The method of claim 5, wherein the silicon dioxide of said second insulating material is comprised of low temperature LPCVD oxide.

14. The method of claim 1, wherein the silicon dioxide of said second insulating material is comprised of low temperature LPCVD oxide.

* * * * *